United States Patent [19]

Preves

[11] Patent Number: 4,888,810
[45] Date of Patent: Dec. 19, 1989

[54] ANALOG VOLUME CONTROL CIRCUIT

[75] Inventor: David A. Preves, Edina, Minn.

[73] Assignee: Argosy Electronics, Eden Prairie, Minn.

[21] Appl. No.: 299,726

[22] Filed: Jan. 19, 1989

Related U.S. Application Data

[63] Continuation-in-part of Ser. No. 81,754, Aug. 5, 1987.

[51] Int. Cl.$^4$ .............................................. H03G 3/00
[52] U.S. Cl. ................................... 381/109; 307/554; 307/568; 330/86; 330/282
[58] Field of Search ...................... 381/105, 109, 104; 330/282, 86; 307/264, 554, 568; 455/253

[56] References Cited

U.S. PATENT DOCUMENTS

| | | | |
|---|---|---|---|
| 3,952,211 | 4/1976 | Eberhard | 307/264 |
| 3,962,651 | 6/1976 | Mc Call | 307/264 |
| 4,085,340 | 4/1978 | Salesky et al. | 307/264 |
| 4,137,466 | 1/1979 | Schemmel et al. | 330/86 |
| 4,466,120 | 8/1984 | Walker, Jr. et al. | 381/109 |
| 4,528,686 | 7/1985 | Dressler | 381/109 |
| 4,679,240 | 7/1987 | Heide | 381/104 |

FOREIGN PATENT DOCUMENTS

| | | | |
|---|---|---|---|
| 0139109 | 6/1986 | Japan | 381/109 |
| 0015506 | 1/1988 | Japan | 330/282 |

OTHER PUBLICATIONS

Mollinga, "The FET as a Voltage-Controlled Resistor", EEE, Jan. 1970.

Primary Examiner—Forester W. Isen
Attorney, Agent, or Firm—Haugen and Nikolai

[57] ABSTRACT

A volume control circuit for hearing aids is adjustable to vary a control signal supplied to an amplifier between a microphone and receiver of a hearing air. The volume control circuit includes a positive voltage source, a charge holding circuit, and a switch for alternatively connecting the holding circuit with the positive voltage source to increase its voltage, with ground to decrease voltage, and with an open circuit to maintain a constant voltage. The holding circuit voltage is inverted around a predetermined reference voltage level, with the inverted signal amplified and applied to the gate terminal of an n-channel field effect transistor having its source terminal biased to a predetermined source voltage level, and its drain terminal electrically connected to the amplifier to provide the control signal. In response to charging of the holding circuit, the gate voltage is reduced to increase the FET impedance, thus decreasing the gain of the amplifier.

11 Claims, 2 Drawing Sheets

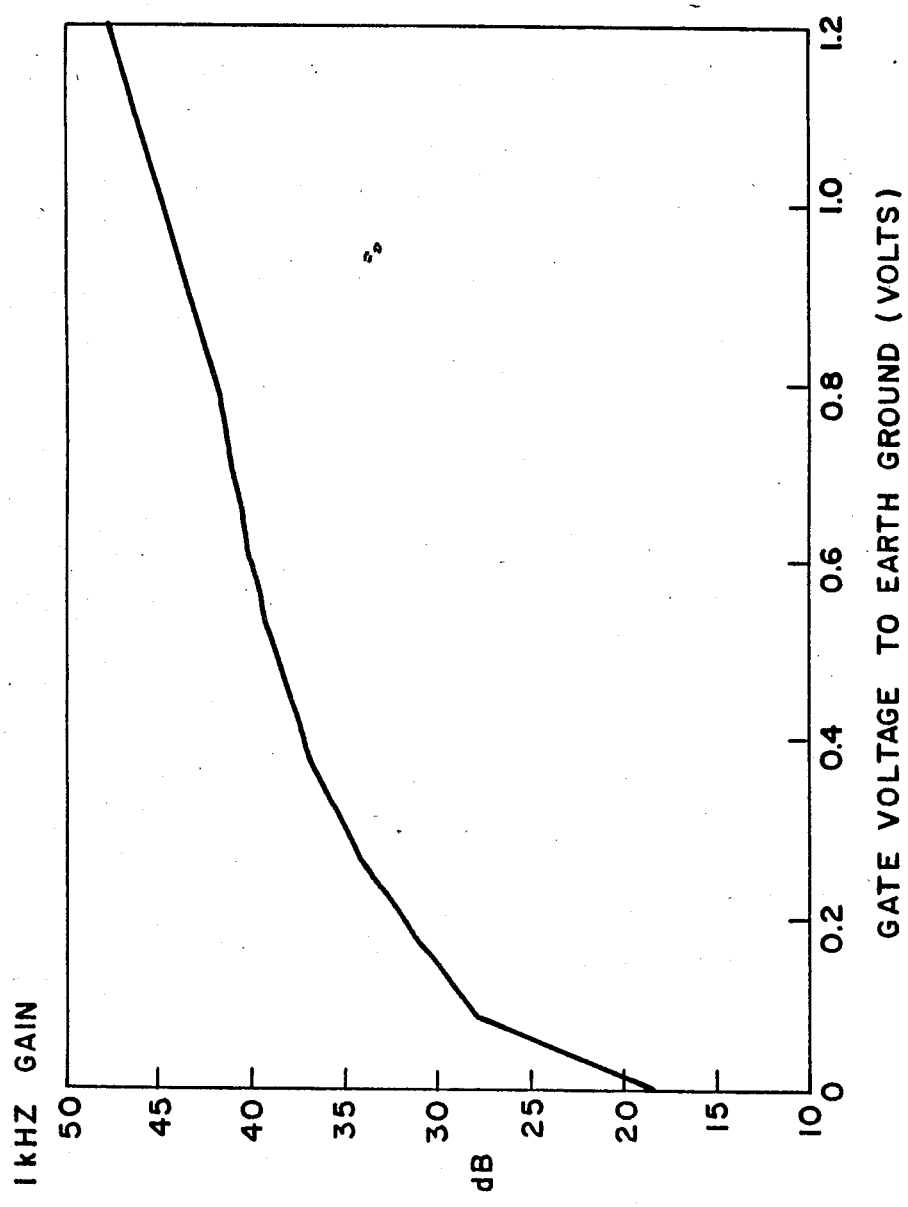

ANALOG VOLUME CONTROL CIRCUIT

CROSS-REFERENCE TO RELATED APPLICATION

This application is a continuation-in-part of application Ser. No. 07/081,754, filed Aug. 5, 1987.

BACKGROUND OF THE INVENTION

This invention relates to electrical circuits for processing sensed audio signals, and more particularly to hearing aid circuits for adjustably controlling the amount such audio signals are amplified.

An important feature in virtually any hearing aid is the volume control, through which the user can select a desired gain or amount of sound amplification and modify the gain to meet changing circumstances, for example a change in the level of background noise. Traditionally, hearing aid volume control devices are subminiature potentiometers of mechanical construction. Typically, a resistance strip is used in combination with a wiping device, controlled for example by a rotatable dial manipulated by the user.

Even when relatively new, the mechanical devices often include discontinuities that effect various settings, particularly where different types of resistive material are joined in a particular resistive strip. In the course of long term use, the resistance strip surfaces are damaged by the rubbing action of the wiping component, eventually resulting in "scratchy" circuit noise whenever the volume control is adjusted. In fact, deficiencies in volume control devices are among the most frequent causes of hearing aid failures.

The recognition of these problems has given rise to efforts to improve the mechanical components in volume controls or alternatively to replace them with electrical components. For example, U.S. Pat. No. 4,385,204 to Wine granted May 24, 1983 discloses a single push button volume control in which an up-/down counter, in conjunction with a digital-to-analog converter, controls an audio amplifier. Another approach to volume control is shown in U.S. Pat. No. 4,549,098 to Fushiki granted Oct. 22, 1985. Fushiki employs an up/down counter in conjunction with a digital-to-analog converter, and further utilizes a field effect transistor as a "touch detector" to generate a binary logical "1" when a variable resistor is being depressed, and a logical "0" when the resistor is not being depressed.

These devices, while satisfactory in certain respects, fall short of the need for a simple, low-cost and reliable volume control, preferably with analog rather than digital implementation techniques.

SUMMARY OF THE INVENTION

Therefore, it is an object of the present invention to provide a volume control circuit for hearing aids which eliminates the need for mechanical components, particularly the resistance strip and wiping component.

Another object of the invention is to provide a volume control apparatus with analog means, without the need for a digital-to-analog converter.

Yet another object of the invention is to reduce or eliminate the effects of reduced battery voltage on a hearing aid volume control system.

To achieve these and other objects, there is provided an apparatus for adjustably controlling the amplification of audio signals received at a hearing aid. The apparatus includes an audio sensing means for sensing the sound pressure level of an audio signal and generating a first electrical signal corresponding to the sensed audio signal. The apparatus further includes an amplifier means having a signal input for receiving said first electrical signal and a control input for receiving an electrical control signal. The amplifier generates a second electrical signal corresponding to the first electrical signal and amplified according to a gain determined by the level of the control signal. A receiver means generates an amplified audio signal corresponding to the second electrical signal. A control means is provided for supplying the control signal to the control input. The control means includes a field effect transistor, a means for biasing a source terminal of the field effect transistor at a first predetermined voltage level, a means for electrically connecting a drain terminal of the field effect transistor to the control input, and a manually operable means for selectively varying a gate Voltage level at a gate terminal of the field effect transistor, thereby to selectively vary the conductivity of the field effect transistor between said drain and source terminals.

The means for selectively varying the gate voltage preferably include a holding circuit and a manually operable switch movable among three discrete positions including a first closed position for electrically connecting the holding circuit to a positive voltage source to increase the voltage level in the holding circuit, a second closed position for electrically connecting the holding circuit to ground to decrease the voltage level in the holding circuit, and an open position for substantially maintaining the voltage level of the holding circuit. The means further can include a comparator means having a first comparator input proportional to the holding circuit voltage level, and a second comparator input biased to a second predetermined voltage level. The comparator generates a gate voltage level based on the difference between the first and second comparator inputs. Preferably, the second predetermined voltage is substantially less than the level at the positive voltage source.

The comparator further can include means for inverting the comparator output, with a result that a voltage negative with respect to the second predetermined voltage level is provided to the gate terminal whenever the first comparator input is greater than the second predetermined voltage.

Another aspect of the present invention is a process for adjustably controlling the volume of audio signals generated by a hearing aid receiver, including the steps of:

sensing an audio signal and generating a first electrical signal corresponding to the sensed audio signal;
 providing said first electrical signal as an input to an amplifier to provide, as an output of said amplifier, a second electrical signal having a level determined according to a selectively variable gain of said amplifier;
 providing a gain control signal as a control input to said amplifier, wherein said gain is selectively variable responsive to changes in the level of said gain control signal;
 biasing the source terminal of a field effect transistor to a first predetermined voltage level, providing said gain control signal to said amplifier from a drain terminal of said field effect transistor, and selectively varying a gate voltage applied to a gate terminal of said field effect transistor to selectively vary the source to drain conductivity of said field effect transistor.

The apparatus and process of the present invention provide a hearing aid in which troublesome mechanical components are virtually eliminated from the volume control system. The volume level, more particularly the selected gain of the hearing aid amplifier, is controlled by the level of the input from the drain terminal of the field effect transistor. This control signal, in turn, is proportional to the conductivity of the field effect transistor, in that the source terminal is biased at a constant voltage. As a result, the gain control impedance is determined by the voltage level at the gate of the field effect transistor. The voltage levels and transistor are selected so that the field effect transistor, an n-channel transistor operating in the enhanced mode, operates within a range where its conductivity between drain and source has an at least generally a logarithmic relationship to the gate-to-source voltage. This relationship, together with the gradual, controlled response of the holding circuit, ensures a precise, gradual volume control easily manipulated by the operator by positioning a normally open rocker switch into either the first or second closed position for a desired amount of time. Further, because a field effect transistor is employed in an analog mode, the desired analog response is achieved directly, without the need for added digital to analog conversion circuitry. Finally, as the source terminal biasing voltage and the predetermined input to the comparator both are proportional to the battery, they decay along with the positive voltage source, typically a battery. Consequently, battery decay does not alter the performance of the field effect transistor to control volume.

IN THE DRAWINGS

The above and other objects and advantages are more readily appreciated from consideration of the following detailed description in view of the drawings, in which:

FIG. 1 is a schematic view of a hearing aid volume control circuit constructed in accordance with the present invention; and FIG. 2 is a graph illustrating the operation of the circuit of FIG. 1.

DETAILED DESCRIPTION OF THE PREFERRED EMBODIMENT

Figure 1:
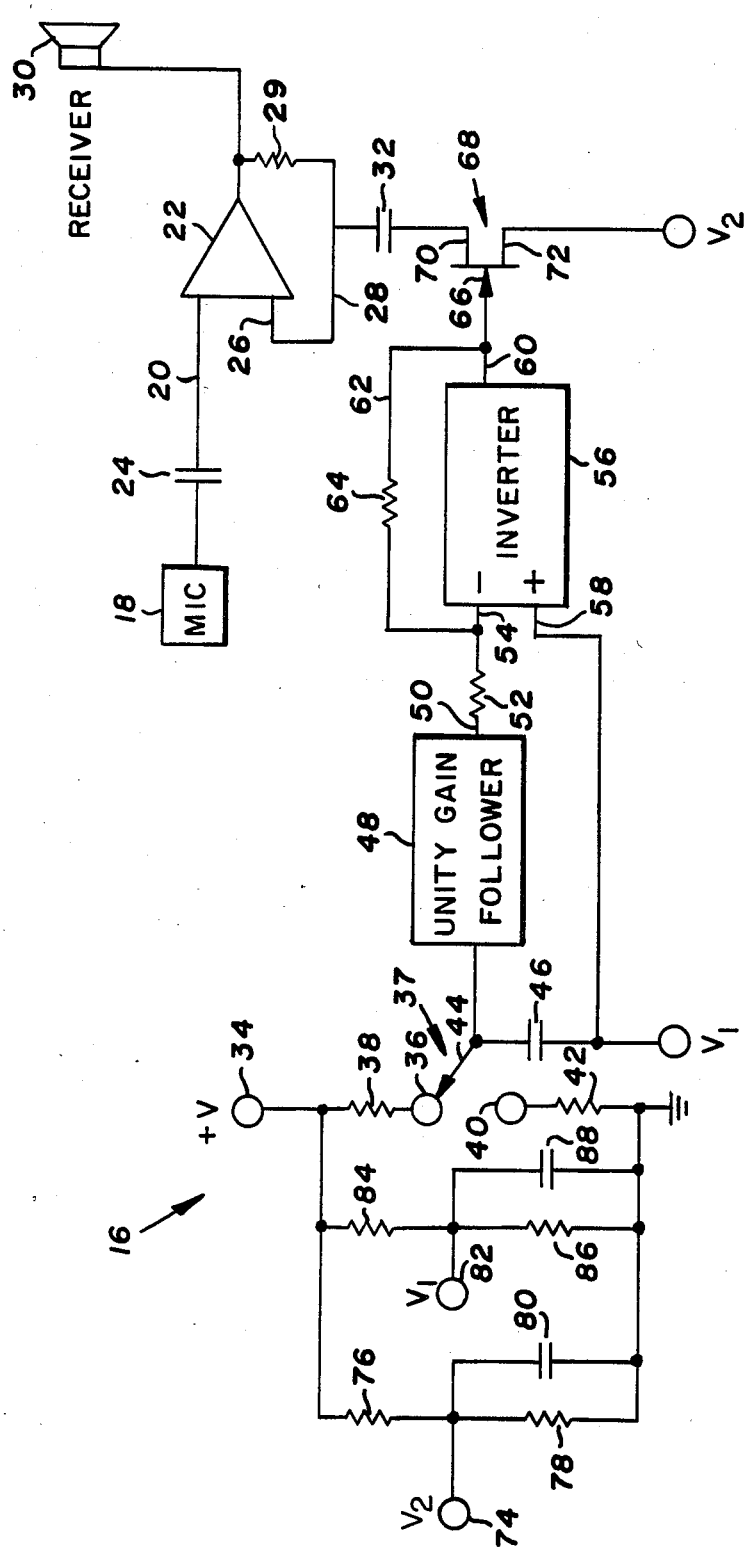

Turning now to the drawings, there is shown in FIG. 1 a simplified hearing aid circuit 16. The hearing aid circuit includes a microphone 18 for receiving audio signals, and converting the audio signals to electrical signals. Microphone 18 is coupled to a first input 20 of an amplifier 22 through a coupling capacitor 24. Amplifier 22 is a monolithic integrated circuit amplifier having an adjustably controlled gain. More particularly, the gain of amplifier 22 varies in accordance with the impedance applied to a second or control input 26 of the amplifier, which input is part of a feedback loop 28 including a resistance 29. Over the normal operating range of amplifier 22, the gain tends to increase in a logarithmic relationship with the impedance at control input 26. The amplified electrical signal output of amplifier 22 is supplied to a receiver 30, where the amplified electrical signal is converted to an acoustic signal for the benefit of the hearing aid user.

The volume control portion of circuit 16 is coupled to control input 26 through a coupling capacitor 32. Coupling capacitors 24 and 32 cooperate to form a two-pole high-pass filter.

A battery provides a source of positive voltage to the volume control circuit, as indicated by a +V at a battery terminal 34. Battery terminal 34 is connected to a first switching terminal 36 of a switch 37 through a resistor 38. A second switching terminal 40 is connected to ground (i.e. zero voltage) through a resistor 42. A switching contact 44 is normally open, but movable alternatively into two closed positions: a charge position, in which contact 44 engages first terminal 36, and a discharge position in which the contact engages second terminal 40. Switch 37 can be constructed as a rocker switch spring biased into the open position.

Movable contact 44 is connected to a holding circuit, consisting of a hold capacitor 46 and a unity gain follower 48, which preferably is a CMOS operational amplifier. Gain follower 48 substantially prevents a charge leakage from hold capacitor 6, in effect tending to maintain a constant voltage level in the holding circuit— particularly at an output 50 of the unity gain follower— so long as switch 37 remains open.

The gain follower output is provided through a resistor 52 to a negative input 54 of a comparator or inverter 56, which preferably is a CMOS amplifier. The positive input 58 of inverter 56 is biased to a predetermined pseudo-ground reference level $V_1$. The inverter input provided by the holding circuit thus is shifted about reference voltage $V_1$ and inverted to provide an inverter output voltage at an output terminal 60 of the inverter. A feedback loop 62 including a resistor 64 provides a selected voltage gain across the inverter, as determined by selection of resistors 52 and 64. In summary, the voltage in the holding circuit is inverted, shifted in level and amplified to provide a gate control voltage as the output of inverter 56.

The control voltage output of inverter 56 is provided to a gate terminal 66 of an n-channel field effect transistor (FET) 68 having a relatively low resistance between its drain terminal 70 and source terminal 72 when in the forward biased condition, and a high resistance when reversed biased. Preferably, FET 68 has a pinch-off (gate to source) voltage of about one volt. Source terminal 72 is biased to a predetermined source voltage level $V_2$.

Both inverter reference voltage $V_1$ and FET source voltage $V_2$ are proportional to positive source voltage +V, so that aging of the battery has a negligible effect on volume control circuit performance. In particular, a source biasing terminal 74 is connected between battery terminal 34 and ground, and between two resistors 76 and 78 having an equal resistance. Consequently, the voltage level at terminal 74, $V_2$, is equal to one-half of battery voltage +V. A bypass capacitor 80 is coupled between terminal 74 and ground.

In similar fashion, an inverter biasing terminal 82 is connected between battery terminal 34 and ground, and also between resistors 84 and 86. Resistor 84 has a substantially larger resistance than resistor 86, so that the voltage level at terminal 82, $V_1$, preferably is about one-sixth of the battery voltage. A bypass capacitor 88 is coupled between terminal 82 and ground.

It is apparent from the arrangement of terminals 74 and 82 that the voltage levels at these terminals decay at the same rate as the battery voltage. Thus, the proportional relationship between +V which charges the holding circuit, the inverter reference voltage $V_1$, and the source voltage $V_2$ of FET 68, remains essentially constant. Battery decay has virtually no effect on volume control circuit performance.

FET 68 preferably operates in the enhancement mode, and does not conduct when its gate voltage and source voltage are equal. Resistors 52, 64, and voltage level $V_1$ are selected such that when the voltage level in the holding circuit is at or substantially equal to ground, there is a positive voltage at gate 66 substantially equal to $V_2$. However, because the unity gain follower output is inverted around reference voltage $V_1$, the gate voltage is reduced as the voltage level in the holding circuit increases resulting in a negative gate to source voltage to turn off FET 68 and prevent conduction across the source and drain terminals, thereby providing a high impedance at terminal 26 and allowing maximum negative feedback. In addition, resistors 52 and 64 are selected to multiply inverter output by about three, to increase the variable impedance range provided by FET 68 when changing the holding circuit voltage.

As long as switching contact 44 remains engaged with first switching terminal 36, hold capacitor 46 continues to accumulate charge to raise the voltage level in the hold circuit, thus further reducing the voltage at gate terminal 66. Since the voltage at source terminal 72 remains constant at $V_2$, the decrease in gate voltage decreases the conductivity of FET 68, resulting in an increased impedance applied to control input 26 of amplifier 22. As seen from FIG. 2, the gain across amplifier 22, particularly at 1 kHz, is linear over a 0.8 volt range of change in the gate terminal voltage level. Preferably, the resistances which determine gate voltage and source voltage are selected to position this linear response range within an expected range of normal adjustment by the hearing aid user. As seen from FIG. 2, within the total response range of approximately 30 dB, there is linear response range from about 36 to 47 dB.

One preferred version of the volume control circuit employs the following parameters for its various elements:

+V: 1.3 volts
$V_1$: 0.22 volts
$V_2$: 0.65 volts
Resistor 38: 150k ohms
Resistor 42: 270k ohms
Resistor 52: 610k ohms
Resistor 64: 2.7M ohms
Resistors 76 and 78: 15k ohms
Resistor 84: 10k ohms
Resistor 86: 2k ohms
Capacitor 46: 6.8 microfarads A user operates the volume control circuit simply by manipulating a rocker switch in a direction either to charge hold capacitor 46 or in a direction to discharge the hold capacitor. The resistance values of resistors 38 and 42 are selected to provide an appropriate rate of charge and discharge, respectively. In particular, the gain of amplifier 22 changes rapidly enough to yield a noticeable change in volume in response to user manipulation, and avoids abrupt changes.

To increase volume, a user simply depresses the rocker switch in the direction to discharge capacitor 46, and holds it in place for the time necessary to yield the desired volume increase. A desired decrease in volume is accomplished in similar fashion, by pressing the switch to charge capacitor 46.

I claim:

1. An apparatus adjustably controlling the amplification of audio signals received by a hearing aid, said apparatus including:
   an audio sensing means for receiving an audio signal and generating a first electrical signal corresponding to said sensed audio signal;
   an amplifying means having a signal input for receiving said first electrical signal, and a control input for receiving an electrical control signal, for generating a second electrical signal corresponding to said first electrical signal and amplified in accordance with a gain determined by the level of said control signal;
   a receiver means for generating an acoustic signal corresponding to said second electrical signal; and
   a control means for providing said control signal to said control input, including a field effect transistor, a biasing means for biasing a source terminal of said field effect transistor at a first predetermined voltage level, a coupling means for electrically connecting a drain terminal of said field effect transistor to said control input, and a manually operable means for selectively varying a gate voltage level applied to a gate terminal of said field effect transistor, thereby to selectively vary the conductivity of said field effect transistor between said drain and source terminals;
   said manually operable means for selectively varying the gate voltage level including a holding circuit, and a switch movable among three discrete positions, including a first closed position for electrically connecting said holding circuit to a positive voltage source to increase the voltage level in said holding circuit, a second closed position for electrically connecting the holding circuit to ground to decrease the voltage level in said holding circuit, and an open position for maintaining a substantially constant voltage level in said holding circuit; and
   a comparator means having a first input proportional to said holding circuit voltage level and a second input biased to a second predetermined voltage level, said comparator means generating a difference signal proportional to the difference between the voltage levels at said first and second inputs, and providing said difference signal to said gate terminal as said gate voltage level.

2. The apparatus of claim 1 wherein:
said comparator means further includes means for providing a negative voltage to said gate terminal whenever said first input voltage is greater than said second predetermined voltage level.

3. The apparatus of claim 2 wherein:
said first and second predetermined voltage levels are proportional to the voltage level at said positive voltage source.

4. The apparatus of claim 3 wherein:
said holding circuit includes a hold capacitor and a unity gain follower comprising a first CMOS operational amplifier.

5. The apparatus of claim 3 wherein:
said comparator means includes a second CMOS amplifier.

6. The apparatus of claim 1 wherein:
said coupling means includes a coupling capacitor.

7. The apparatus of claim 1 wherein:
said field effect transistor is an n-channel transistor operating in the enhancement mode.

8. A process for adjustably controlling the volume of an audio signal produced in a hearing aid receiver, including:

sensing an audio signal and generating a first electrical signal corresponding to the sensed audio signal;

providing said first electrical signal as an input to an amplifier to provide, as an output of said amplifier, a second electrical signal having a level determined according to a selectively variable gain of said amplifier;

generating a gain control signal as a control input to said amplifier, wherein said gain is selectively variable responsive to changes in the level of said gain control signal;

biasing the source terminal of a field effect transistor to a first predetermined voltage level, providing said gain control signal to said amplifier from a drain terminal of said field effect transistor, and selectively varying a gate voltage applied to a gate terminal of said field effect transistor to selectively vary the source to drain conductivity of said field effect transistor; wherein said step of selectively varying said gate voltage includes at least one of the following steps:

(a) connecting a positive voltage source to a holding circuit through a first predetermined resistance for a select amount of time to increase the voltage in said holding circuit a select amount;

(b) connecting said holding circuit to ground through a second predetermined resistance for a selected amount of time to decrease the voltage in said holding circuit a selected amount;

and further includes the steps of:

(c) generating a hold circuit output voltage proportional to the voltage level in said holding circuit;

(d) comparing said hold circuit output voltage to a second predetermined voltage level, and generating a difference signal proportional to the difference between said hold circuit output voltage and second predetermined voltage level; and (e) applying said difference signal to said gate terminal as said gate voltage.

9. The process of claim 8 wherein:

said first and second predetermined voltage levels are proportional to the voltage level of said positive voltage source.

10. The apparatus of claim 1 wherein:

said comparator means includes a feedback means for generating said difference signal as an amplified signal.

11. An apparatus for adjustably controlling the amplification of audio signals received by a hearing aid, said apparatus including:

an audio sensing means for receiving an audio signal and generating a first electrical signal corresponding to said sensed audio signal;

an amplifying means having a signal input for receiving said first electrical signal, and a control input for receiving an electrical control signal, for generating a second electrical signal corresponding to said first electrical signal and amplified in accordance with a gain determined by the level of said control signal;

a receiver means for generating an acoustic signal corresponding to said second electrical signal; and a control means for providing said control signal to said control input, including a field effect transistor, a biasing means for biasing a source terminal of said field effect transistor at a first predetermined voltage level, a coupling means for electrically connecting a drain terminal of said field effect transistor to said control input, and a manually operable means for selectively varying a gate voltage level applied to a gate terminal of said field effect transistor, thereby to selectively vary the conductivity of said field effect transistor between said drain and source terminals;

said manually operable means for selectively varying the gate voltage level including a holding circuit, and a switch movable among three discrete positions, including a first closed position for electrically connecting the holding circuit to a positive voltage source to increase the voltage level in said holding circuit, a second closed position for electrically connecting the holding circuit to ground to decrease the voltage level in the holding circuit, and an open position for maintaining a substantially constant voltage level in said holding circuit, said holding circuit including a hold capacitor and a unity gain follower comprising a first CMOS operational amplifier;

said manually operable means further including a comparator means having a first input proportional to said holding circuit voltage level and a second input biased to a second predetermined voltage level, said comparator means generating a difference signal proportional to the difference between the voltage levels at said first and second inputs, and providing said difference signal to said gate terminal as said gate voltage level, said comparator means comprising a second CMOS amplifier.

* * * * *